United States Patent [19]

Schwartz

[11] Patent Number: 4,665,372
[45] Date of Patent: May 12, 1987

[54] METHOD AND CIRCUIT FOR PRODUCING SINUSOIDAL WAVES HAVING HARMONIC ELIMINATION FROM $2\pi$ PERIODICAL SQUARE WAVES

[75] Inventor: Peter U. Schwartz, Bruchkoebel, Fed. Rep. of Germany

[73] Assignee: Honeywell GmbH, Maintal, Fed. Rep. of Germany

[21] Appl. No.: 700,588

[22] Filed: Feb. 11, 1985

[51] Int. Cl.$^4$ .......................... H03K 7/10; H03K 5/00; H03B 28/00
[52] U.S. Cl. .................................... 332/9 R; 307/261; 328/14; 328/21; 328/27
[58] Field of Search ................. 332/9 R, 16 R, 17, 18, 332/31 R, 37 R; 307/260, 261, 262, 264, 268, 271; 328/21, 22, 27, 167, 14; 331/77

[56] References Cited

U.S. PATENT DOCUMENTS

| | | | |
|---|---|---|---|
| 3,100,851 | 8/1963 | Ross et al. | 328/186 X |
| 3,215,860 | 11/1965 | Neumann | 328/186 X |
| 3,544,906 | 12/1968 | Dulaney et al. | 328/14 |
| 3,660,766 | 5/1972 | Hilliard, Jr. | 328/14 |
| 3,838,414 | 9/1974 | Wiles | 328/14 X |
| 4,061,909 | 12/1977 | Bryant | 328/14 X |

FOREIGN PATENT DOCUMENTS 0008830 1/1979 Japan ................................... 307/260

Primary Examiner—Eugene R. LaRoche
Assistant Examiner—D. C. Mis
Attorney, Agent, or Firm—Mitchell J. Halista; Trevor B. Joike

[57] ABSTRACT

A method for producing sinusoidal waves uses the steps of generating a plurality of clock signals during a $2\pi$ period, using the clock signals to control the generation of $2\pi$ periodical square wave pulses having preselected length and phase relationships during respective ones of the clock signals and applying the square wave pulses to a low pass filter. The reduction of pulse length as well as the phase relationship of the pulses is evaluated from a system of equations by setting the odd harmonics of corresponding Fourier series to zero or to a predetermined minimum value. A circuit device utilizing this method uses a switching amplifier operated in a binary sequence having a period corresponding to the desired sine wave period and a low pass filter connected to the output of the amplifier. A clock oscillator having a clock frequency higher than the frequency of the desired sine wave controls the amplifier via a sequencer having a counter stepped by the oscillator with the counter outputs being applied to the switching amplifier through a logic circuit.

1 Claim, 34 Drawing Figures

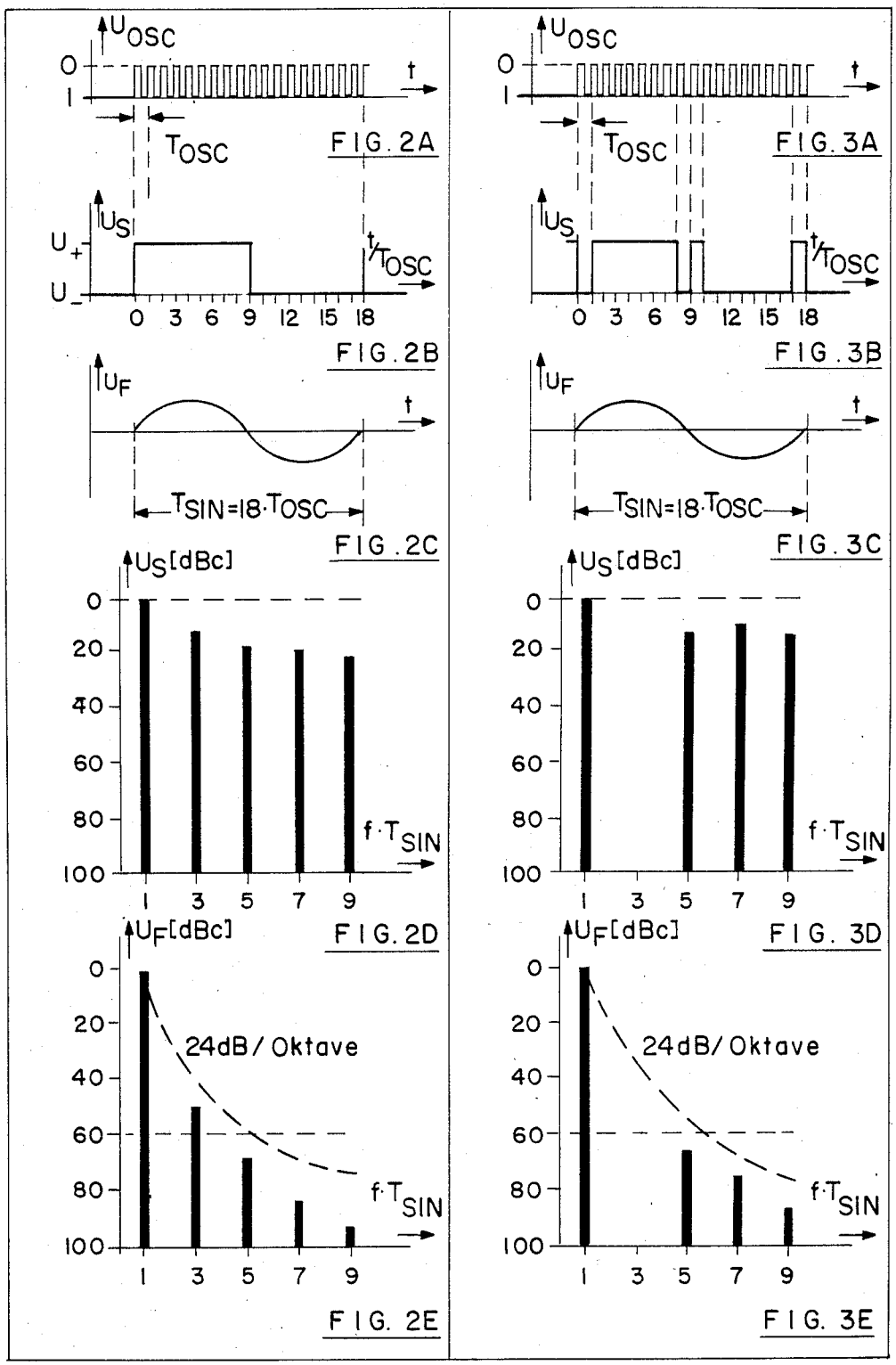

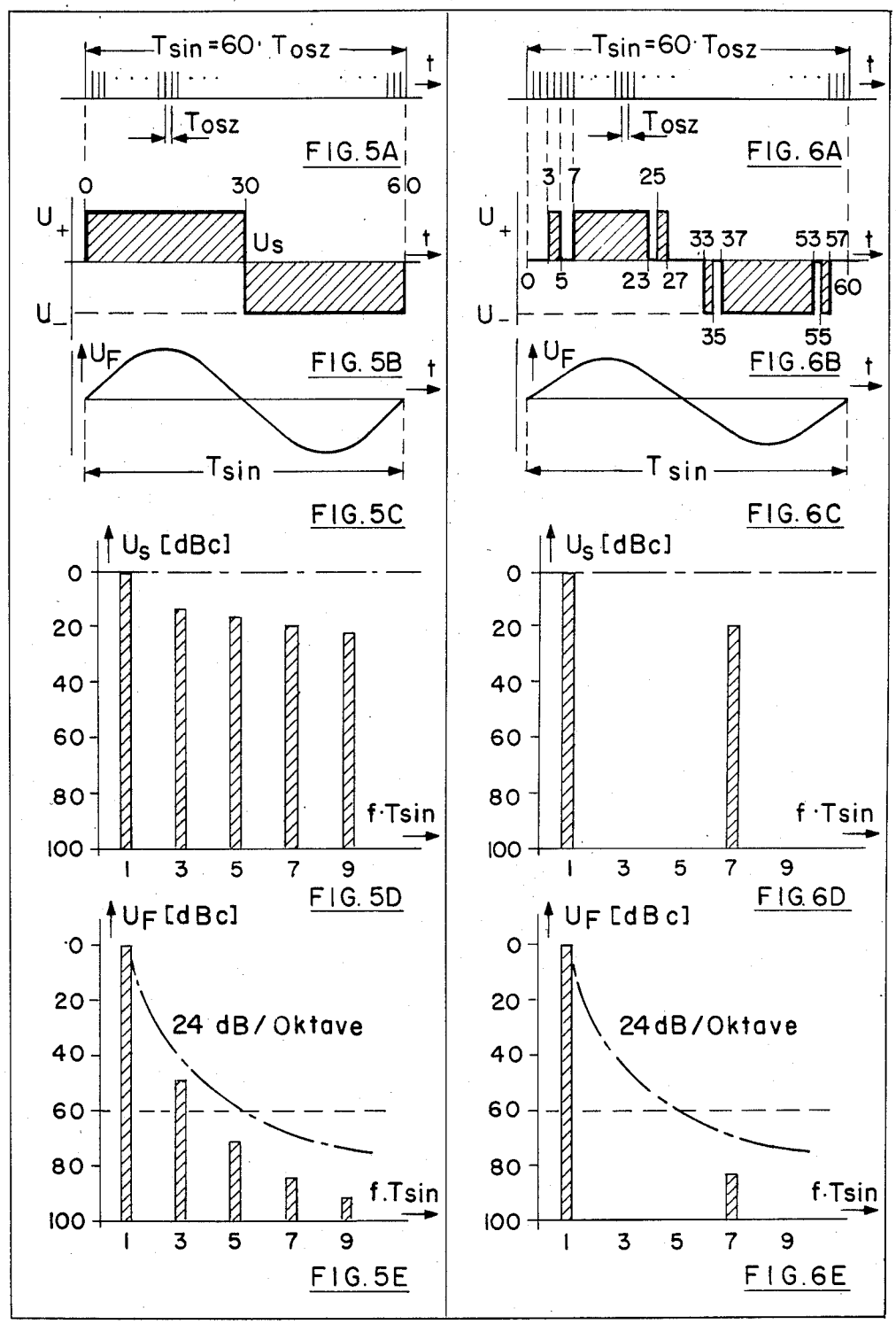

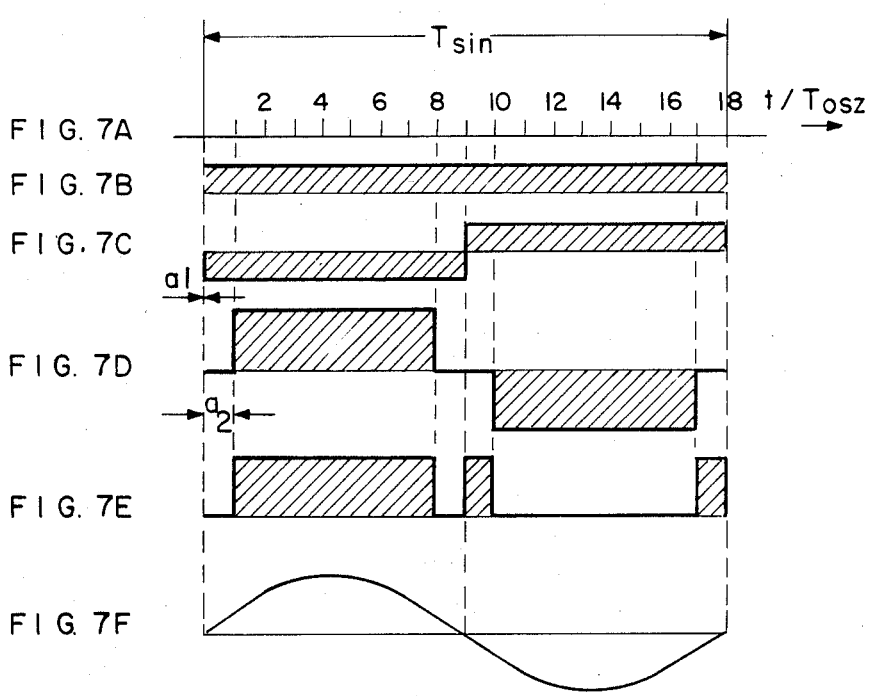

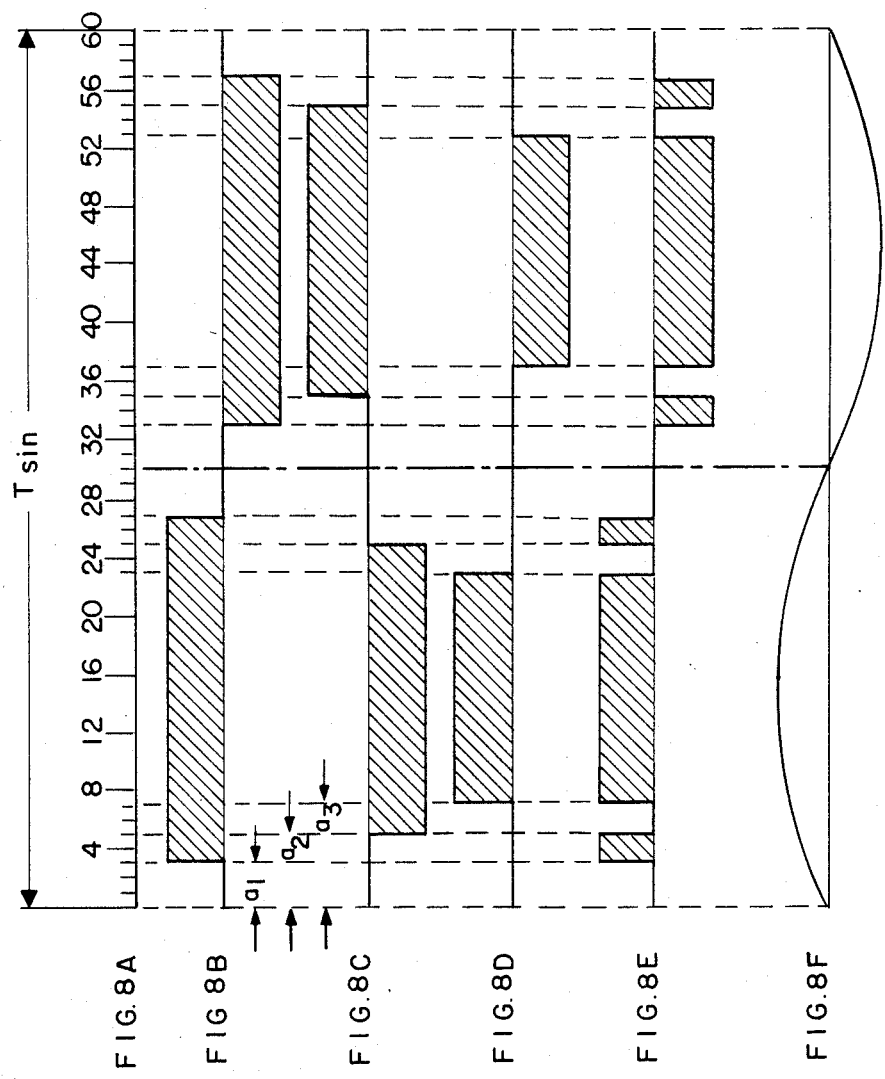

METHOD AND CIRCUIT FOR PRODUCING SINUSOIDAL WAVES HAVING HARMONIC ELIMINATION FROM $2\pi$ PERIODICAL SQUARE WAVES

BACKGROUND OF THE INVENTION

1. Field of the Invention

The present invention relates to a method for producing sinusoidal waves as well as to a circuit device for implementing the method.

2. Description of the Prior Art

In so-called sine wave generators, the need for a low non-linear harmonic-distortion factor usually exists, i.e., the signal power of all the output harmonics together shall be small with respect to the signal power of the fundamental output wave. Sine wave generators with a low distortion factor are required in the measuring of the linearity of a transmission system and for producing a carrier for the data transmission via telephone wires and other supply lines. Furthermore, sine waves with a low distortion factor simplify the control of electrical motors. Basically sine waves may be produced using analog and digital techniques. In analog sine wave generators, an oscillator defines the signal frequency as well as the signal behavior. In order to reduce the distortion factor of the sine wave generator the amplifiers used are allowed to have only a small signal distortion. This limits the frequency range to upper frequency values, allows only a small output power and aggravates integration of the circuit on a semiconductor chip. In a digital sine wave generator an oscillator ony defines the signal frequency, whereas the behavior is controlled by digitally stored information. This information alternatively defines within an oscillator period either the signal amplitude at constant pulse width or the pulse width at constant signal amplitude, respectively. For controlling the signal amplitude linear amplifiers are also required, so that problems arise which are similar to the problems of analog sine wave generators.

A pulse width modulation requires a fine time resolution of the sine wave period in order to produce a signal with low distortion. This requires a high oscillator frequency with respect to the desired sine wave frequency. Since the switching time of power transistors is significant, sine wave generators with pulse width modulation may be used only for low frequencies as a result of the limitations of the switching amplifier.

Furthermore, it is known from the technique of static inverters to convert DC voltages into square wave voltages by means of switch-operated transistors and to convert those square wave voltages by means of low pass filters into a sinusoidal output voltage. In order to eliminate essentially the high content of harmonics within the square wave voltage and in order to produce sine waves with a low distortion factor, high demands are placed on the low pass filter.

Furthermore, it is known from U.S. Pat. No. 3,215,860 as well as from U.S. Pat. No. 3,100,851 to superimpose phase-shifted square wave voltages of equal frequencies with a predetermined amplitude rating in such a way that periodic components of said square wave voltage which contribute to the harmonics of the sine wave to be produced are eliminated, whereas the periodic components which contribute to the fundamental wave are summed up. The methods and circuit devices described there are relatively complex because they need means for phase-shifting of the square wave voltages, for recognition of their amplitudes and for superimposing. Accordingly, it would be desirable to provide a method and circuit device for producing sinusoidal waves which would produce low distortion sine waves utilizing a novel method and simple apparatus which overcomes the aforesaid shortcomings of the prior art.

SUMMARY OF THE INVENTION

An object of the present invention is to provide an improved method for producing sinusoidal waves.

Another object of the present invention is to provide an improved circuit device utilizing a novel method for producing sinusoidal waves.

In accomplishing these and other objects, there has been provided, in accordance with the present invention, a method for producing sinusoidal waves includes the steps of generating a plurality of clock signals during a $2\pi$ period, using the clock signals to control the generation of $2\pi$ periodical square wave pulses having preselected length and phase relationships during respective ones of the clock signals and applying the square wave pulses to a low pass filter. A circuit device utilizing this method uses a switch amplifier operated in a predetermined binary sequence, the period of which corresponds to the desired sine wave period and a low pass filter connected to the output of the switch amplifier.

BRIEF DESCRIPTION OF THE DRAWINGS

A better understanding of the present invention may be had when the following description is read in connection with the accompanying drawings, in which:

FIGS. 2A to 2E illustrate the relationships with respect to an amplitude and frequency spectrum in production of a sine wave from a pure unipolar square wave sequence of known form, FIGS. 3A to 3E illustrate the corresponding relationships in production of a minimum sequence according to the present invention, FIGS. 5A to 5E illustrate the relationship with respect to an amplitude and frequency spectrum in production of a sine wave from a pure bipolar square wave sequence of known form, FIGS. 6A to 6E illustrate the corresponding relationships in production of a minimum sequence according to the present invention, FIGS. 7A to 7F are signal diagrams for explaining the derivation of the minimum sequence according to FIG. 3B and FIGS. 8A to 8F are signal diagrams for explaining the derivation of the minimum sequence according to FIG. 6B.

DESCRIPTION OF THE PREFERRED EMBODIMENT

Figure 1:
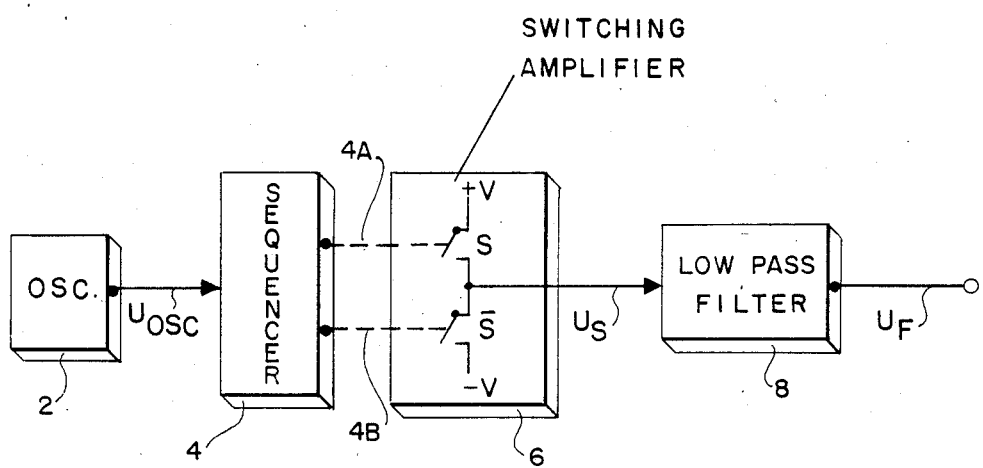
FIG. 1 is a schematic illustration of an example of a circuit device embodying the present invention.

According to FIG. 1, an oscillator 2 controls a sequencer. The sequencer 4 for instance may comprise a binary counter (not shown) which is controlled at its counting input from the oscillator 2 and which counts back from a preset count to zero. In attaining the zero count the counter again is set to the predetermined count. By combining the binary outputs of the counter in an appropriate logic means the desired sequence may be produced.

The sequencer 4 with its outputs 4A,4B controls respective switches S and $\bar{S}$ of a switching amplifier 6, whereat the switches S and $\bar{S}$ by their actuation are switching supply voltages $+V$ and $-V$ to the output of the switching amplifier 6. The output voltage $U_s$ of the switching amplifier 6 is fed to a low pass filter 8, the output of which is the produced sine wave as an output voltage $U_F$.

The required power with respect to the output voltage $U_F$ directly may be supplied by the switching amplifier 6 if the low pass filter 8 consists of passive components and shows a low resistance for the fundamental wave. In this case, the circuit device does not include any active components which otherwise are used for linear functions.

Basically the sequencer 4 being fed by the oscillator 2 may also control the switching amplifier 6 in such a way that the known square wave sequence is produced. FIGS. 2A to 2C show the clock frequency of the oscillator, the produced square wave sequence and the sine wave from the filter 8. The FIGS. 2D and 2E show the amplitude spectrum in front of and after the low pass filter 8, whereat a low pass filter is used which has an attenuation of 24 db per octave.

In contrast to this common square wave sequence, a sequence is produced according to the present invention from the oscillator clock 2 output shown in FIG. 3A by means of the sequencer 4 and the switching amplifier 6, which sequence is shown in FIG. 3B. To this end, the sequencer 4 closes the switch $\bar{S}$ during the first period of the oscillator clock 2 so that during this clock period the supply voltage U− is fed to the low pass filter 8. During the following seven clock periods of the oscillator 2, the sequencer 4 closes the switch S and at the same time opens the switch $\bar{S}$ so that during this time period the supply voltage U+ is fed to the low pass filter 8. Afterwards the switch $\bar{S}$ is closed during one following clock period of the oscillator 2 and then the switch S is closed during a subsequent clock period of the oscillator 2. During the following seven clock periods of the oscillator 2, the switch $\bar{S}$ is closed, and finally the switch S again is closed during one later clock period of the oscillator. In this way a minimum sequence of 18 oscillator clock periods results which is shown in FIG. 3B with the sequence having an amplitude spectrum in front of and after the low pass filter 8 which is shown in FIGS. 3D and 3F. As may be seen from these figures, third harmonics is completely suppressed and, with the aforesaid filter being used, the minimum separation between the fundamental and the harmonics is 66 dbc, whereas in using the known square wave sequence, this separation is only 47 dbc. It can be shown that during longer sequences an even larger separation between the fundamental and the harmonics may be achieved.

With FIGS. 7A–7F, it is analytically shown how the minimum sequence according to FIG. 3B or 7E, respectively, may be achieved. However, it should be emphasized that according to the present invention, any superposition of signals for attaining the desired purpose, namely reduction of the contents of harmonics, is not necessary. The superposition shown in FIG. 7 only is used to explain with respect to an embodiment how the shortening of the square wave pulse and the length and phase of the pulses to be inserted may be evaluated.

It needs no further explanation that the sequence according to FIG. 7E is an addition of the signals according to FIGS. 7B–7D. The signal according to FIG. 7B is given by the following function:

$$f_{(7b)} = A/2$$

For the signals according to FIGS. 7C and 7D the following Fourier series may be written down:

$$f_{(7c)} = \frac{4A}{2\pi}\left(-\cos\alpha_1 \cdot \sin x - \frac{1}{3}\cos 3\alpha_1 \cdot \sin 3x - \frac{1}{5}\cos 5\alpha_1 \cdot \sin 5x - \ldots\right)$$

$$f_{(7d)} = \frac{4A}{\pi}\left(\cos\alpha_2 \cdot \sin x + \frac{1}{3}\cos 3\alpha_2 \cdot \sin 3x + \frac{1}{5}\cos 5\alpha_2 \cdot \sin 5x + \ldots\right)$$

The fundamental of the combined sequence then is given by the following expression:

$$A_1 = (4A/2\pi)(-\cos\alpha_1 + 2\cos\alpha_2)$$

The first appearing harmonic within this sequence is given by the following expression:

$$A_3 = \frac{4A}{2\pi}\left(-\frac{1}{3}\cos 3\alpha_1 + \frac{2}{3}\cos 3\alpha_2\right)$$

If this harmonic shall not appear, then the following is true:

$$\cos 3\alpha_2 = (\tfrac{1}{2})\cos 3\alpha_1$$

For $\alpha_1 = 0$ results $\cos 3\alpha_1 = 1$
Therefrom results:

$$\cos 3\alpha_2 = 0.5$$
$$3\alpha_2 = \pi/3$$
$$\alpha_2 = \pi/9 = 20°$$

To produce the sequence according to FIG. 7E an oscillator is required which delivers eighteen clock pulses within the period of the desired sine wave. After the first clock pulse has been produced, the switching amplifier 6 connects the voltage U+ according to the amplitude A to the low pass filter 8. This voltage is retained during seven clock pulses of the oscillator 2. Then, during one clock pulse, the voltage U− is applied to the low pass filter 8. During the next following pulse, the voltage U+ is again applied to the low pass filter 8 and, then, during the next seven clock pulses, the voltage U− is applied to the low pass filter 8. Finally, during the next one clock pulse, the voltage U+ is again applied to the low pass filter 8.

Figure 4:
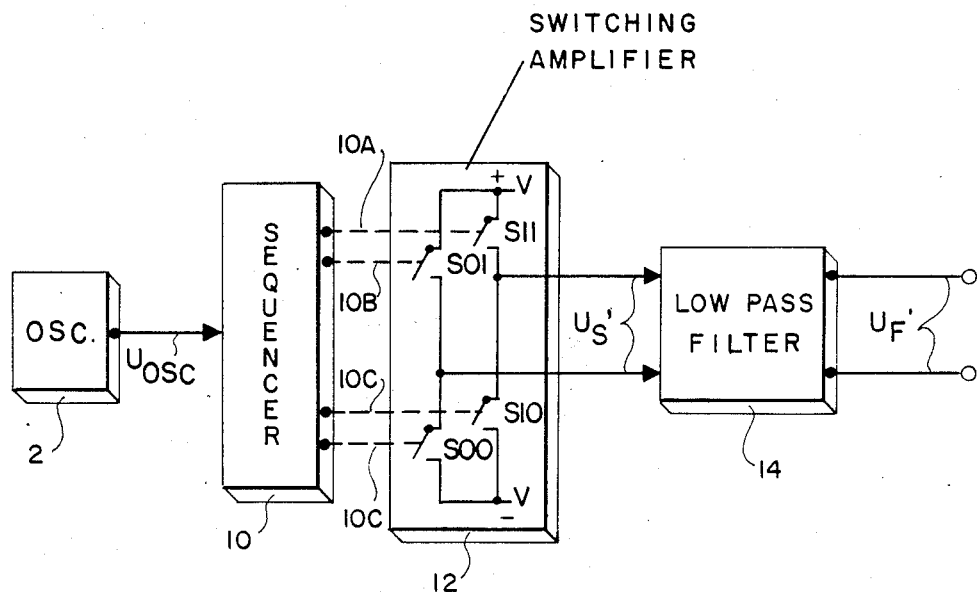
FIG. 4 is a schematic illustration of a second embodiment of a circuit device according to the invention.

The circuit device shown in FIG. 4 differs from the circuit device shown in FIG. 1, in particular by the use of another type of switching amplifier 12 and of a modified low pass filter 14. The switching amplifier 12 comprises four switches S00 to S11, whereat on one hand two switches S00 and S10 are connected in parallel to the supply voltage U− and on the other hand two switches S01 to S11 are connected in parallel to the other supply voltage U+. Two switches S00 and S01 as well as S10 and S11 each are connected in series between the supply voltages, whereat a junction common to the switches S00 and S01 is connected to the negative input of the low pass filter and a further junction common to the switches S10 and S11 is connected to the positive input of the low pass filter 14. The low pass filter 14 for instance may be symmetrically designed and may comprise only passive components. By actuation of the series connected switches or the cross-coupled switches according to the output signals of the sequencer 10 the voltages, O, U+−U− and −(U+−U−) may be produced at the input of the low pass filter.

With the circuit device according to FIG. 4, bipolar pulses may be produced as shown in FIGS. 5B and 6B, whereat FIG. 5B again shows the known bipolar square wave sequence and FIG. 6B shows a bipolar square wave sequence modified according to the invention.

Again within FIGS. 5 and 6 from the top to the bottom the clock frequency of the oscillator, the produced square wave sequence, the sine wave from the low pass filter 14 and the amplitude spectrum before and after the low pass filter 14 are shown, whereat a low pass filter with an attenuation of 24 db per octave again is used. It may be taken from FIGS. 6D and 6E that within the bipolar square wave sequence modified according to the invention and shown in FIG. 6B the third, fifth and ninth harmonics are not contained.

With respect to FIGS. 8A and 8F again it is analytically shown how the minimum sequence according to FIG. 6B or 8E, respectively, is achieved. The sequence according to FIG. 8E mathematically is given as a superposition of the three $2\pi$-periodical square wave pulses shown in FIGS. 8B to 8D for which the following Fourier series are valid:

$$f_{(8b)} = \frac{4A}{\pi}\left(\cos\alpha_1 \cdot \sin x + \frac{1}{3}\cos 3\alpha_1 \cdot \sin 3x + \frac{1}{5}\cos 5\alpha_1 \cdot \sin 5x + \ldots\right)$$

$$f_{(8c)} = \frac{4A}{\pi}\left(-\cos\alpha_2 \cdot \sin x - \frac{1}{3}\cos 3\alpha_2 \cdot \sin 3x - \frac{1}{5}\cos 5\alpha_2 \cdot \sin 5x - \ldots\right)$$

$$f_{(8d)} = \frac{4A}{\pi}\left(\cos\alpha_3 \cdot \sin x + \frac{1}{3}\cos 3\alpha_3 \cdot \sin 3x + \frac{1}{5}\cos 5\alpha_3 \cdot \sin 5x + \ldots\right)$$

The fundamental of the resulting sequence then is given by the following expression:

$$A_1 = (4A/\pi)(\cos\alpha_1 - \cos\alpha_2 + \cos\alpha_3)$$

The appearing harmonics are given by the following expressions:

$$A_3 = \frac{4A}{\pi}\left(\frac{1}{3}\cos 3\alpha_1 - \frac{1}{3}\cos 3\alpha_2 + \frac{1}{3}\cos 3\alpha_3\right)$$

$$A_5 = \frac{4A}{\pi}\left(\frac{1}{5}\cos 5\alpha_1 - \frac{1}{5}\cos 5\alpha_2 + \frac{1}{5}\cos 5\alpha_3\right)$$

$$A_7 = \frac{4A}{\pi}\left(\frac{1}{7}\cos 7\alpha_1 - \frac{1}{7}\cos 7\alpha_2 + \frac{1}{7}\cos 7\alpha_3\right)$$

$$A_9 = \frac{4A}{\pi}\left(\frac{1}{9}\cos 9\alpha_1 - \frac{1}{9}\cos 9\alpha_2 + \frac{1}{9}\cos 9\alpha_3\right)$$

If these harmonics shall not appear, the following conditions must be fulfilled:

$$\cos 3\alpha_1 - \cos 3\alpha_2 + \cos 3\alpha_3 = 0 \qquad (1)$$

$$\cos 5\alpha_1 - \cos 5\alpha_2 + \cos 5\alpha_3 = 0 \qquad (2)$$

$$\cos 7\alpha_1 - \cos 7\alpha_2 + \cos 7\alpha_3 = 0 \qquad (3)$$

$$\cos 9\alpha_1 - \cos 9\alpha_2 + \cos 9\alpha_3 = 0 \qquad (4)$$

It can be shown that the equations (1), (2) and (4) are satisfied if the angles each have the following values:

$$\alpha_1 = (3/30)\cdot\pi = 18°$$

$$\alpha_2 = (5/30)\cdot\pi = 30°$$

$$\alpha_3 = (7/30)\cdot\pi = 42°$$

The sequence according to FIGS. 7E and 8E only represent two examples from a plurality of possible examples. A lot of variations are possible and result from the existing requests, i.e., which harmonics alone or in combination shall be suppressed or shall not exceed a predetermined value, respectively. Those sequences as a function of the given requests in particular may be evaluated by an appropriate computer program, an example of which is given in the attached Appendix A in a Fortran language. As a result basically more than one pulse may be added to the pulse space. However, all resulting sequences are symmetrical with respect to $\pi/2$ and $3/2\pi$ as well as mirror symmetrical to $\pi$.

This method according to the invention and the indicated circuit device also provide possibilities for the following further modifications:

In each event the amplitude of the fundamental can be proportionally changed according to the supply voltage level U+−U−. By means of a DC voltage controller the output amplitude of the sine wave generator may be controlled, whereat a reference input also can be used for modulation of the amplitude.

A frequency modulation is also possible in the described sine wave generator when the clock frequency of the oscillator 2 is modulated, whereat a binary frequency keying as well as a continuous frequency change may be used. A further possibility for frequency modulation results from switching between sequences of different lengths, whereat a binary sequence keying as well as a step-wise quasicontinuous frequency change with a series of stepped sequence lengths can be implemented.

A phase modulation of the described sine wave generator is possible by inverting the sequence. This results in a binary 180° phase keying. A further possibility of phase modulation provides inserting of shorter or longer sequences, respectively, which also allows to attain a phase change smaller than 180°.

The method according to the invention has the advantage of producing the desired sine waves having a reduced contents of harmonics by means of a pure binary sequence of equal amplitude without any superimposing of square waves. Depending on the switching amplifier used and the switched voltages, unipolar and bipolar pulses may be produced which before being filtered do not contain certain harmonics or contain such harmonics appropriately attenuated, respectively. The present method and the circuit device used for implementing said method show further advantages which are to be seen in the following points: The distortions normally produced by linear amplifiers are eliminated. The expenditure with respect to the low pass filter connected to the output is reduced. The amplitude of the produced sine wave may be controlled independent of its frequency. A frequency modulation as well as a phase modulation is digitally and quasi-continuously controllable. The frequency of the produced sine wave digitally can be started and stopped at predetermined points. The signal output can be digitally switched into a highly resistive circuit. A high sinusoidal power may be achieved with high efficiency. Finally, the total circuit device may be easily integrated on a semiconductor chip.

Accordingly, it may be seen that there has been provided, in accordance with the present invention, an improved method and circuit device for producing sinusoidal waves.

The embodiments of the present invention in which an exclusive property or privilege is claimed are defined as follows:

1. A method for producing sinusoidal waves including the steps of generating a plurality of clock signals during a $2\pi$ period, utilizing the clock signal to generate $2\pi$ periodical square wave pulses having preselected length and $2\pi$ period position relationships during respective ones of the clock signals and applying the generated square wave pulses to a low pass filter wherein the pulse sequence of said $2\pi$ periodical square wave is symmetrical with respect to $\pi/2$ wherein said length and position relationship of said pulses is evaluated from a system of equations by setting the odd harmonics of corresponding Fourer series to zero or to a predetermined minimum value.

* * * * *